United States Patent [19]
Singh et al.

[11] Patent Number: 5,754,833
[45] Date of Patent: May 19, 1998

[54] METHOD AND APPARATUS FOR PROVIDING SYNCHRONOUS DATA TRANSMISSION BETWEEN DIGITAL DEVICES OPERATING AT FREQUENCIES HAVING A P/Q INTEGER RATIO

[75] Inventors: Gurbir Singh, Portland; Michael W. Rhodehamel, Beaverton, both of Oreg.

[73] Assignee: Intel Corporation, Santa Clara, Calif.

[21] Appl. No.: 788,356

[22] Filed: Jan. 24, 1997

Related U.S. Application Data

[63] Continuation of Ser. No. 240,344, May 10, 1994, abandoned.

[51] Int. Cl.$^6$ ............................................. G06F 1/12
[52] U.S. Cl. ............................................. 395/551
[58] Field of Search ................................. 395/551

[56] References Cited

U.S. PATENT DOCUMENTS

| | | | |
|---|---|---|---|
| 4,095,267 | 6/1978 | Morimoto | 395/550 |
| 4,779,093 | 10/1988 | Watkins . | |
| 4,873,703 | 10/1989 | Crandall et al. | 395/550 |
| 4,881,165 | 11/1989 | Sager et al. . | |
| 4,881,364 | 11/1989 | Grenzebach . | |
| 4,893,271 | 1/1990 | Davis et al. | 395/556 |
| 4,979,190 | 12/1990 | Sager et al. . | |
| 5,003,537 | 3/1991 | Sager . | |
| 5,243,703 | 9/1993 | Farmwald et al. | 395/325 |
| 5,256,912 | 10/1993 | Rios | 375/362 |
| 5,347,559 | 9/1994 | Hawkins et al. | 395/550 |
| 5,359,630 | 10/1994 | Wade et al. . | |
| 5,388,249 | 2/1995 | Hotta et al. | 395/550 |
| 5,392,422 | 2/1995 | Hoel et al. | 395/550 |
| 5,448,715 | 9/1995 | Lelm et al. | 395/559 |
| 5,553,275 | 9/1996 | Langendorf | 395/555 |

FOREIGN PATENT DOCUMENTS

| | | |
|---|---|---|
| 0375794 | 12/1988 | European Pat. Off. . |
| 0645717 | 8/1994 | European Pat. Off. . |
| 94306556 | 8/1995 | European Pat. Off. . |

OTHER PUBLICATIONS

"The Metaflow Architecture", pp. 10–13 & 63–75, Popescu, et al., IEEE Micro, 1991 IEEE, *Metaflow Technologies, Inc.*
"PA7200: A PA–RISC Processor with Integrated High Performance MP Bus Interface", pp. 375–382, Kurpanek, et al., 1994 IEEE, *Hewlett–Packard Company.*

*Primary Examiner*—Kevin A. Kriess
*Assistant Examiner*—John Q. Chavis
*Attorney, Agent, or Firm*—Blakely, Sokoloff, Taylor & Zafman

[57] ABSTRACT

An apparatus for synchronously transmitting data between devices operating at different frequencies that have a P/Q integer ratio relationship. The apparatus allows one or more device(s) operating at a high frequency to synchronously exchange data with one or more device(s) operating at a low frequency. The low and high frequencies have a P/Q integer ratio relationship of:

$$\text{low frequency} = (P/Q) \times \text{high frequency};$$

where P and Q represent integer values, P is less than Q, and Q is not necessarily an integer multiple of P. A P/Q clock generator generates one or both of the high and low frequency clocks according to the P/Q frequency ratio. An interface controller receives the high frequency clock and the P and Q values as inputs and generates a high-to-low data transfer signal for enabling data transfers from high frequency to low frequency devices. The interface controller also generates a low-to-high frequency data transfer signal for enabling data transfers from low to high frequency devices. The data transfer signals may be used to latch or qualify transfer data during transfer across frequency boundaries. The data transfer signals indicate safe times, or windows, for transferring data across frequency boundaries. A safe time for transferring data across a frequency boundary is a high frequency clock period where the transfer data is stable and the receiving device can receive the data.

22 Claims, 15 Drawing Sheets

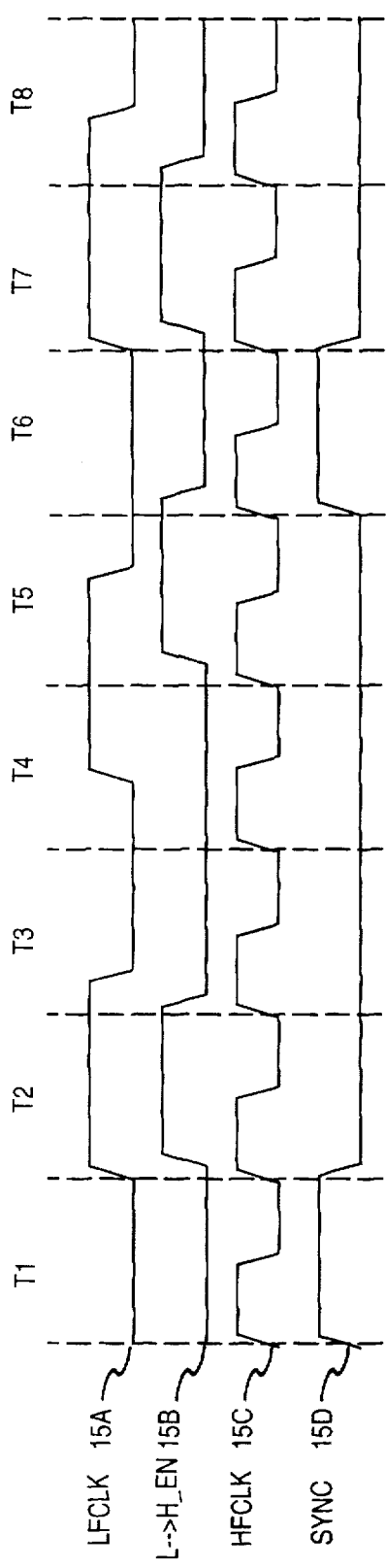
FIG. 2 P=4 AND Q=10
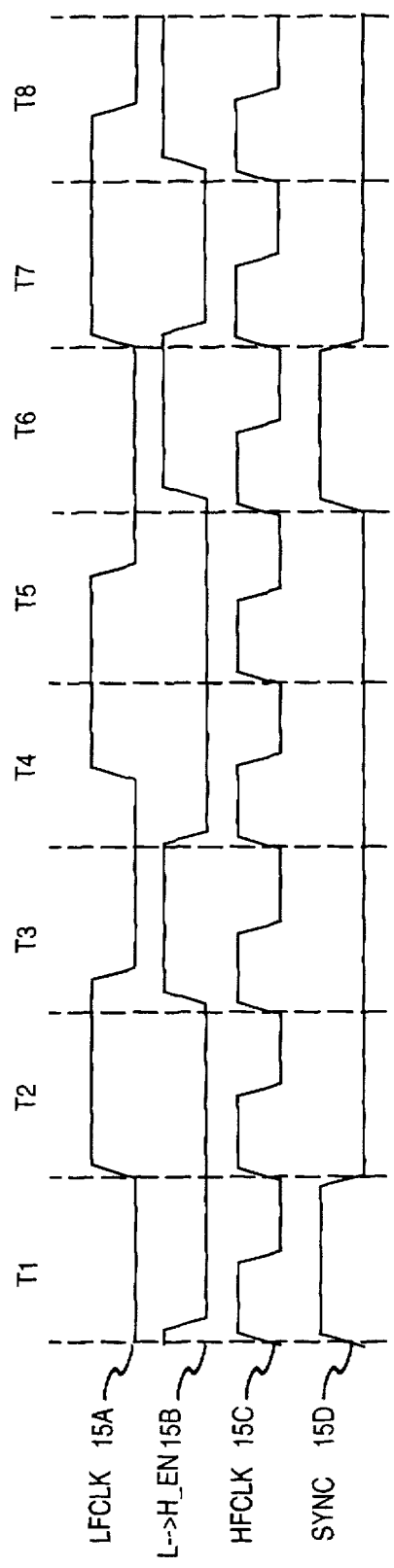
FIG. 3 P=11 AND Q=10

FIG. 5  P=4 AND Q=10

FIG. 6 P=4 AND Q=10

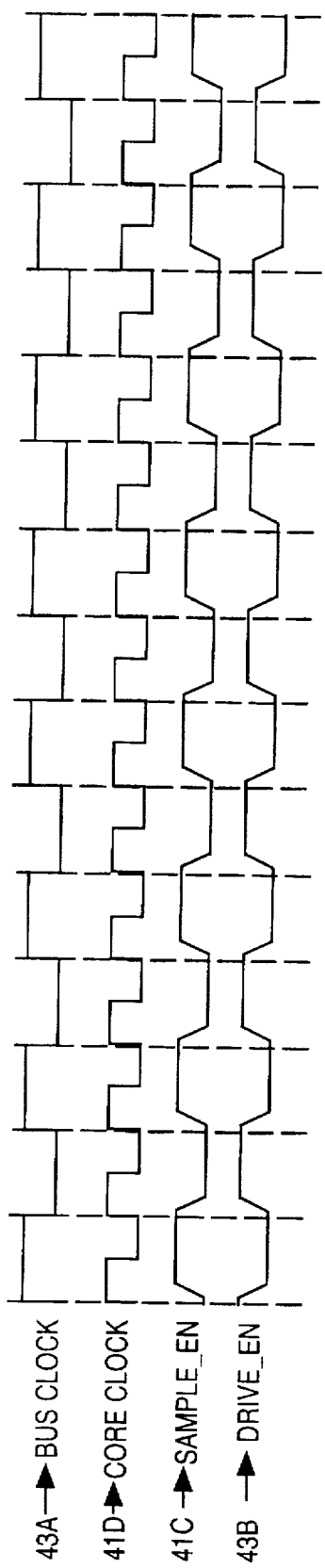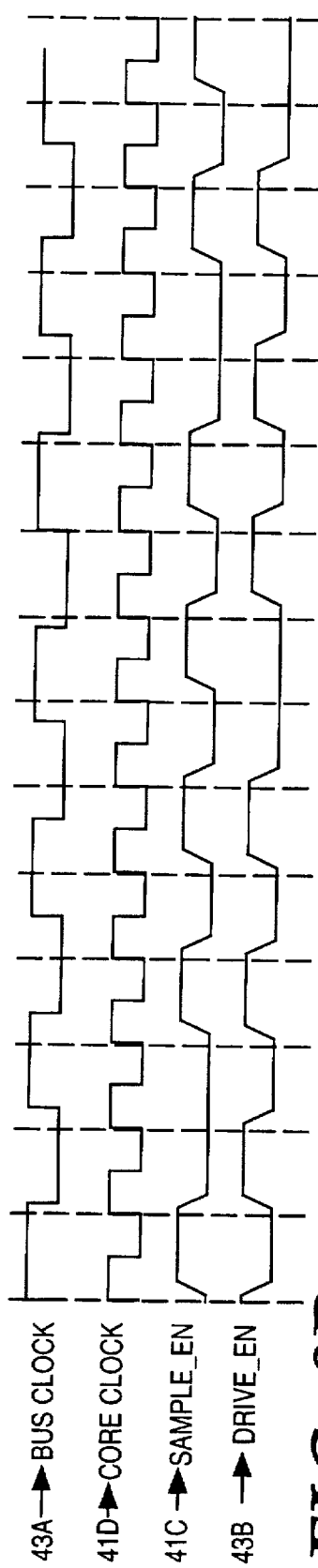

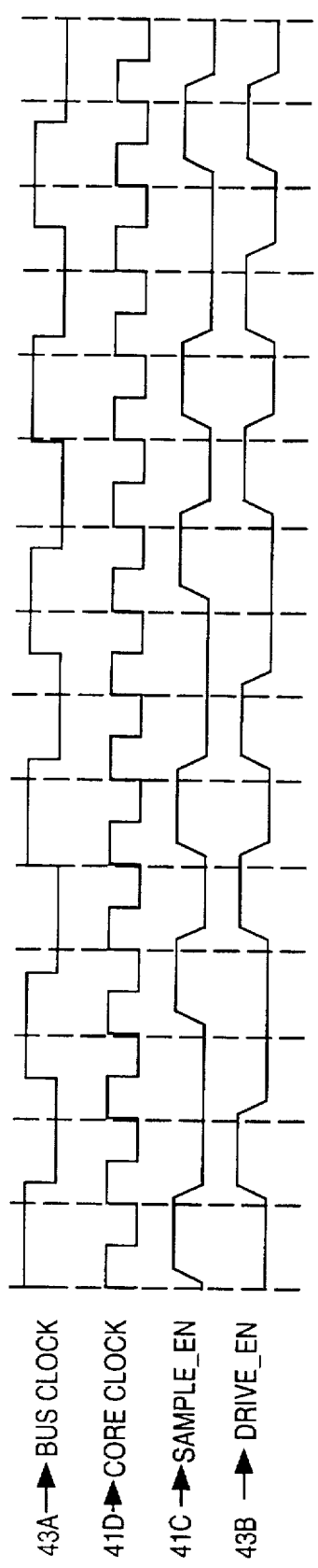
FIG. 8C Q=10→4/10=2/5
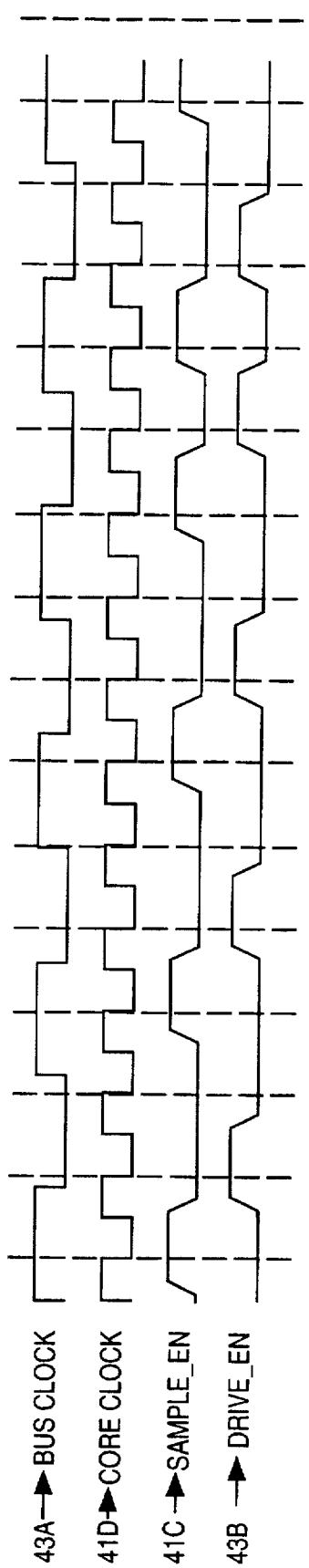
FIG. 8D Q=11→4/11

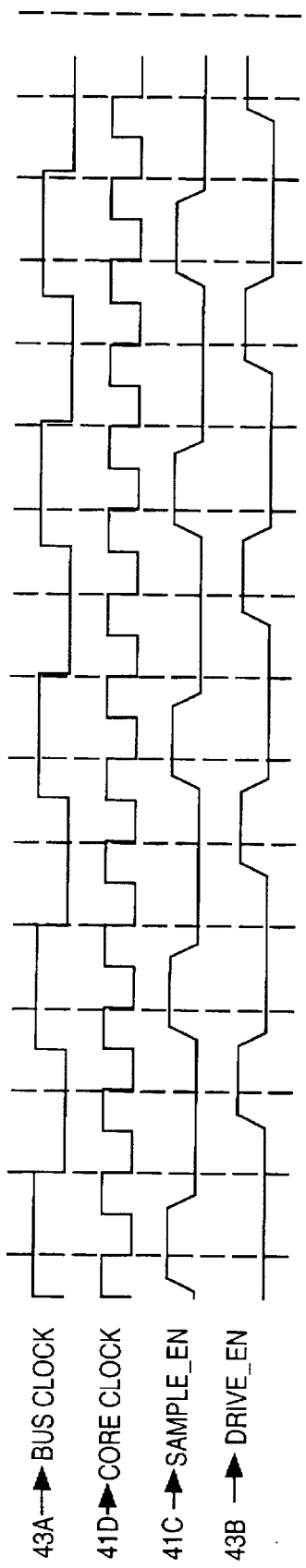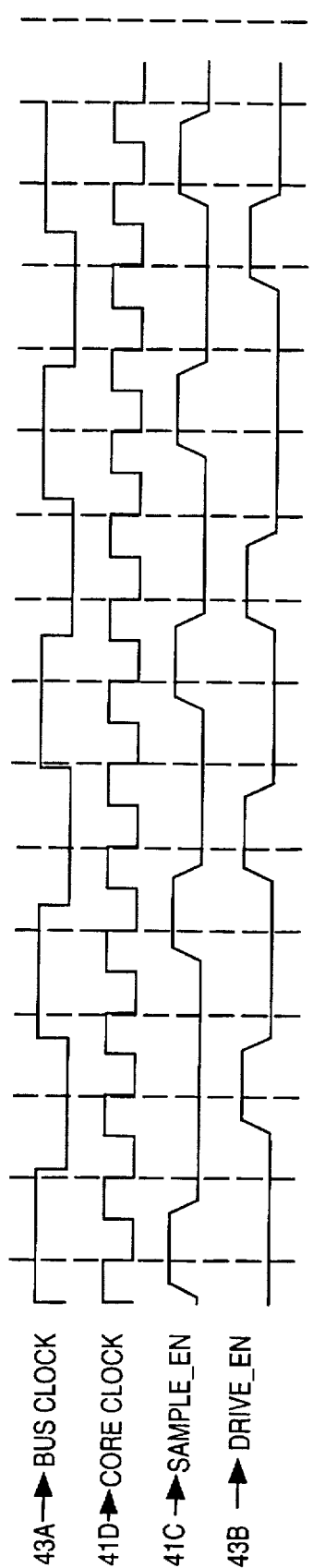

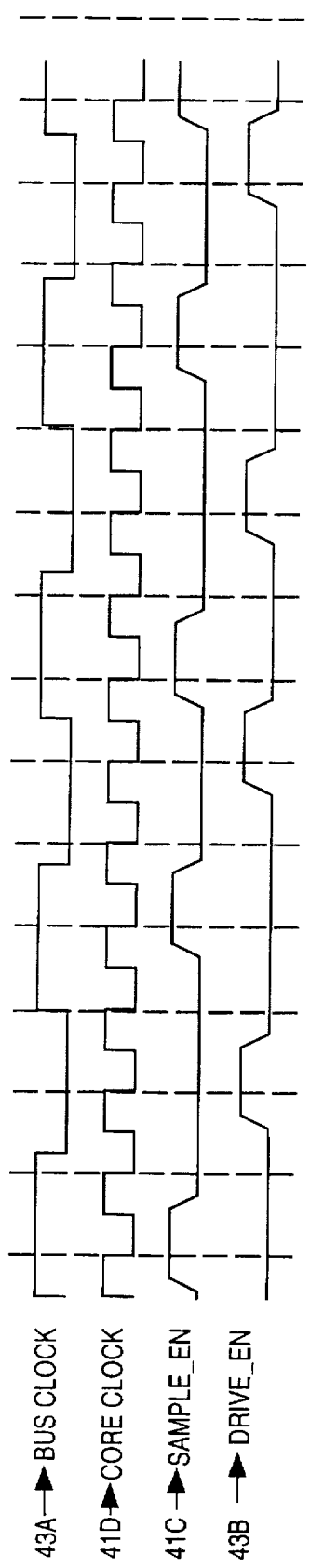
FIG. 8G $_{Q=14 \rightarrow 4/14=2/7}$
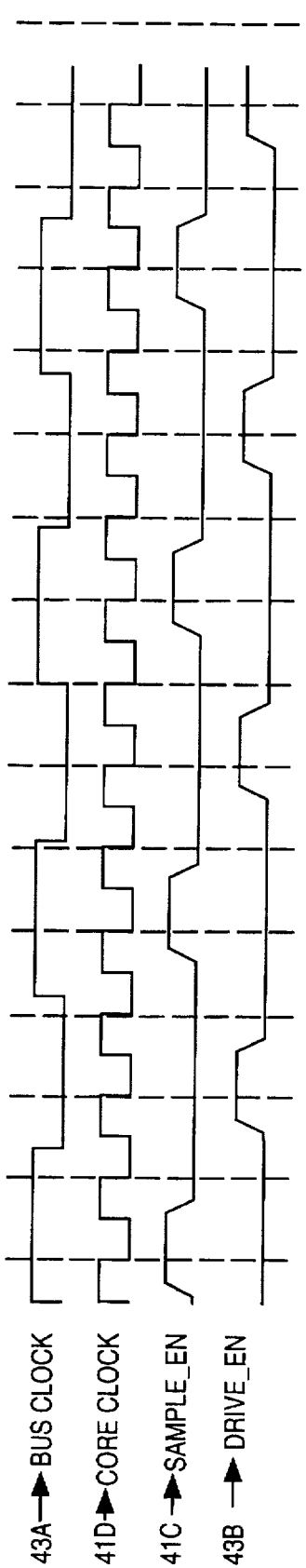
FIG. 8H $_{Q=15 \rightarrow 4/15}$

METHOD AND APPARATUS FOR PROVIDING SYNCHRONOUS DATA TRANSMISSION BETWEEN DIGITAL DEVICES OPERATING AT FREQUENCIES HAVING A P/Q INTEGER RATIO

This is a continuation of application Ser. No. 08/240,344, filed May 10, 1994, now abandoned.

BACKGROUND OF THE INVENTION

1. Field of the Invention

The present invention relates generally to synchronous data transmission, and more specifically to synchronous data transmission between digital logic devices that operate at different frequencies having a P/Q integer ratio relationship.

2. Related Art

Historically, the system frequency of a computer was limited by the available silicon technology. In other words, system board technology was capable of higher frequency operation than that of microprocessors provided by then-available-silicon technology. Computer systems designed using older technologies commonly operated both the system board and the microprocessor at the lower frequency required by the microprocessor. However, because silicon technology has advanced more rapidly over time than system board technology, a crossover has occurred. Today, advanced silicon technology provides microprocessors that are capable of operating at much higher frequencies than currently available system boards.

Besides system board and microprocessor technologies, other situations exist where differing technology constraints may result in distinct frequency domains. For example, a microprocessor and a cache memory may be manufactured using different silicon technologies, each technology providing a different maximum frequency of operation. A microprocessor and a floating point unit may also be operated advantageously at different frequencies. In these examples, the cache memory and/or floating point unit may be either on the same chip (or die) as the CPU, or on a separate chip. Even when manufactured on the same chip, individual functional blocks that exchange data may be advantageously operated at a different frequencies. Other examples of devices that may be advantageously operated at different frequencies are discrete logic components and telecommunications devices. Therefore, the present invention may be applied to a large variety of digital logic and memory devices.

Today, in order to provide high performance computer systems, it is advantageous to operate the microprocessor(s) at its highest possible frequency and other parts of the computer system at a lower frequency dictated by either system board technology or other technology constraints. A significant problem in such computer systems is transferring data between the various components that operate at different frequencies. One solution is to provide an asynchronous data transfer mechanism. Asynchronous data transfer mechanisms are capable of providing accurate data transfer but are often undesirable for use with microprocessors. Asynchronous transfer mechanisms have an inherent design tradeoff between uncertainty in data transfer latency and accuracy of data transfer. Typically, asynchronous transfer mechanisms are designed to optimize data transfer accuracy at the expense of uncertainty in data transfer latency.

Synchronous designs in microprocessors are advantageous over asynchronous designs for several reasons. First, microprocessor design validation tools are optimized for debugging synchronous logic designs. Using synchronous design techniques makes microprocessor design and validation much easier and more reliable. Second, synchronous designs are mandated in fault tolerant computer systems that use a master-checker scheme. In a master-checker system a first processor, the master, operates lock-stepped with a second processor, the checker. During each clock cycle, the checker processor monitors whether the two processors produce identical results on their pins to provide error checking. Because asynchronous data transfer designs do not provide the requisite lock-stepped operation they are not acceptable in master-checker systems.

Some microprocessors operate internally at an integer multiple of the frequency of the computer system bus. In such a computer system, synchronous data transfer between components operating at different frequencies is facilitated by the fact that a data transfer edge of the lower frequency clock corresponds to a data transfer edge of the higher frequency clock. Therefore, the data transfer edge of the lower frequency clock (and/or corresponding data transfer edges of the higher frequency clock) can be used to cause data transfer. However, integer multiple frequency designs only take advantage of quantum-leap improvements in silicon technology. For example, if system board technology is limited to 50 MHz operation then microprocessors operating at 100, 150, 200, ... MHz can be used in an integer multiple design. Suppose that currently available silicon technology provides microprocessors capable of operating at 120 MHz. The additional 20% performance beyond 100 MHz is not utilized in an integer multiple design with a 50 MHz system board. It would be advantageous to provide a microprocessor design capable of operating at more flexible frequency ratios to the system bus while also providing synchronous data transfer between the microprocessor and other devices on the computer system bus. In general, it would be advantageous to provide synchronous data transfer between a variety of digital logic and memory devices that operate according to flexible operational frequency ratios. The present invention provides these advantageous results.

Therefore, a system, method, and apparatus for synchronous data transmission between digital devices operating at frequencies having a P/Q integer ratio relationship is needed.

SUMMARY OF THE INVENTION

The present invention covers a method and apparatus for providing synchronous data transmission between devices operating at frequencies having a P/Q integer ratio relationship, and implementations of the apparatus in a microprocessor and in a computer system. The apparatus provides synchronous data transmission between high frequency and low frequency devices having the following frequency relationship:

$$\text{low frequency} = (P/Q) \times \text{high frequency};$$

where P and Q represent integer values and P is less than Q. The apparatus generates data transfer signals that qualify safe data transmission times, or windows, for synchronously transmitting data between the high and low frequency domains. In one mode, a safe data transmission window is when the transfer data is stable and the receiving device can receive (i.e., is ready to receive) the data.

The present invention apparatus is advantageously used with a high frequency device which operates according to a high frequency clock and also with a low frequency device which operates according to a low frequency clock. The low frequency clock is substantially P/Q times the frequency of the high frequency clock, where P and Q are integer values.

In one embodiment, the present invention apparatus includes: a means for indicating a predetermined phase relationship of the high and low frequency clocks; a means, responsive to the indicating means and the high frequency clock, for generating a first transfer signal during safe transfer windows according to the values of P and Q and the predetermined phase relationship; and a means, responsive to the first transfer signal, for enabling synchronous transfer of data from one of the high and low frequency devices to the other.

In one mode, a safe transfer window is at least one period of the high frequency clock when the data to be transferred is stable and the device receiving the data is capable of receiving the data. In one mode, the predetermined phase relationship is a substantially coincident edge of the high and low frequency clocks. In one mode, P is less than Q and Q is not necessarily an integer multiple of P.

In another embodiment, the present invention includes a means for selecting the values of P and Q. In one mode, the P and Q selector means comprises programmable pins of the apparatus. In another mode, the P and Q selector means comprises a register of the apparatus. In another mode, the P and Q selector means comprises a processor executing an algorithm. In another mode, the P and Q selector means comprises a state machine executing an algorithm.

In a particular implementation of the present invention, the first transfer signal generator means includes: a counter means for generating a count value in response to the high frequency clock and resetting the count value to a predetermined count value in response to the indicator means; and a decoder means, coupled to the counter means, for decoding the count value and the values of P and Q and generating the first transfer signal according to predetermined combinations of P and Q and the count value.

In another embodiment, the present invention includes a P/Q clock generator means for generating one or both of the high and low frequency clocks according to the values of P and Q. In one mode, the P/Q clock generator means is responsive to the high frequency clock to generate the low frequency clock according to the values of P and Q. In another mode, the P/Q clock generator means is responsive to the low frequency clock to generate the high frequency clock according to the values of P and Q.

In a particular implementation, the P/Q clock generator means includes: a frequency divider means, responsive to the low frequency clock, for generating a second signal having a frequency substantially equal to (low frequency clock)/P; and a phase-locked loop, responsive to the second signal, for generating the high frequency clock substantially Q/P times the frequency of the low frequency clock.

BRIEF DESCRIPTION OF THE DRAWINGS

The present invention is illustrated by way of example and not limitation in the figures of the accompanying drawings, in which like references indicate similar elements and in which:

FIG. 2 illustrates one mode of the low-to-high data transfer signal, L-->H_en, generated by the interface controller;

FIG. 3 illustrates one mode of the high-to-low data transfer signal, H-->L_en, generated by the interface controller;

FIGS. 8A–8H illustrate waveforms of the sample_en and drive_en signals generated by the interface controller, in one mode, for P=4 and Q=4–15, respectively;

DETAILED DESCRIPTION OF THE PRESENT INVENTION

A system, method, and apparatus for providing synchronous data transmission between devices operating at frequencies having a P/Q integer ratio relationship is described. In the following description, numerous specific details such as signal names, input or output signal types, device frequencies, clock frequencies, bus frequencies, and P/Q frequency ratios are set forth in order to provide a thorough understanding of the present invention. It will be apparent, however, to one skilled in the art that the present invention may be practiced without these specific details. In other instances, well-known methods and circuits are shown in block diagram form in order not to obscure the present invention. It is understood that the present invention may be comprised of transistor circuits that are readily manufacturable using well-known CMOS (complementary metal-oxide semiconductor) technology, or other equivalent semiconductor manufacturing processes. In addition, the present invention may be implemented with other manufacturing processes for making digital devices.

While in the following discussion the present invention is presented with respect to implementation in a microprocessor, the present invention is not limited to that implementation. Implementations for synchronous data transfer between various digital devices such as discrete logic devices, memory devices, devices either on the same or separate chips, communications devices, etc., are within the scope and spirit of the present invention.

Figure 1:
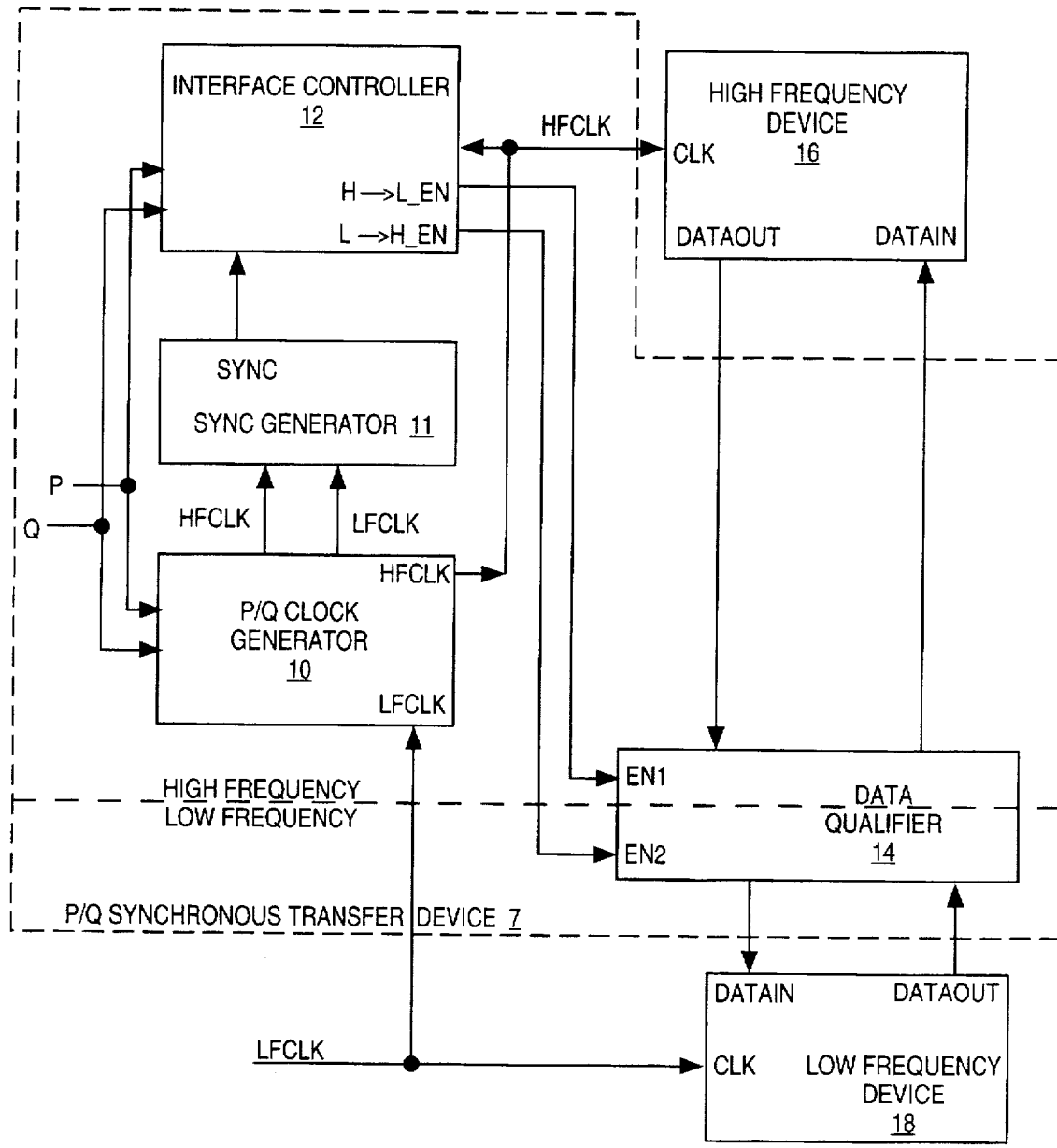
FIG. 1 is a block diagram of one embodiment of the present invention apparatus.

FIG. 1 is a block diagram of one embodiment of the present invention apparatus. The present invention applies generally to digital devices that synchronously exchange data and operate at frequencies having a P/Q integer ratio relationship. Devices in a high frequency domain are clocked by a high frequency clock and devices in a low frequency domain are clocked by a low frequency clock having a frequency that is P/Q times the frequency of the high frequency clock, where P and Q are integer values. In this embodiment P is less than Q to provide the higher/lower frequency relationship. A P/Q synchronous transfer device 7 provides for synchronous data transfer between the high and low frequency devices.

A P/Q clock generator 10 generates one or more of the clocks. In one mode, the P/Q clock generator 10 receives the low frequency clock, LFclk, as an input and generates the high frequency clock, HFclk. In this mode, the P/Q clock generator 10 may be a phase-locked loop. In another mode the P/Q clock generator 10 receives the high frequency clock and generates the low frequency clock. In yet another mode, the P/Q clock generator 10 generates both the high and low frequency clocks. The high and low clock frequencies have a P/Q integer ratio relationship that is determined by the two values P and Q as defined by equation 1:

$$\text{Low Frequency} = (P/Q) \times \text{High Frequency} \qquad (EQ. 1)$$

where P<Q, and P and Q represent integer values.

Figure 1A:
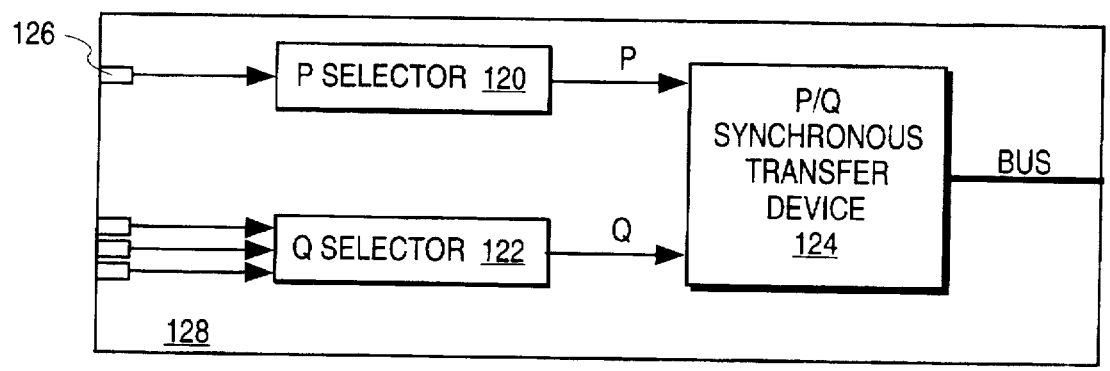
FIG. 1A is a block diagram of a P/Q selector comprising programmable pins.
Figure 1B:
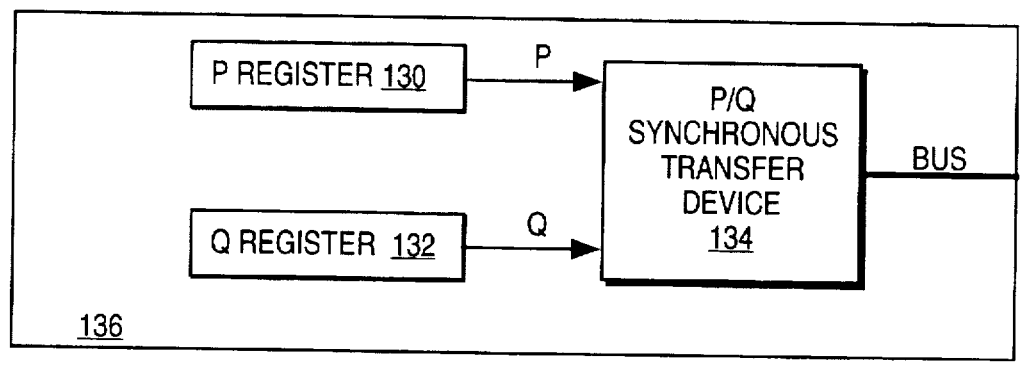
FIG. 1B a block diagram of a P/Q selector comprising a programmable register.
Figure 1C:
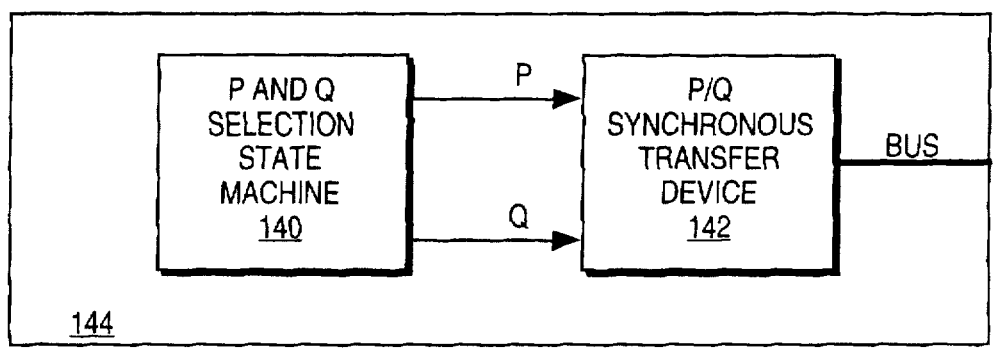
FIG. 1C is a block diagram of a P/Q selector comprising a state machine.
Figure 1D:
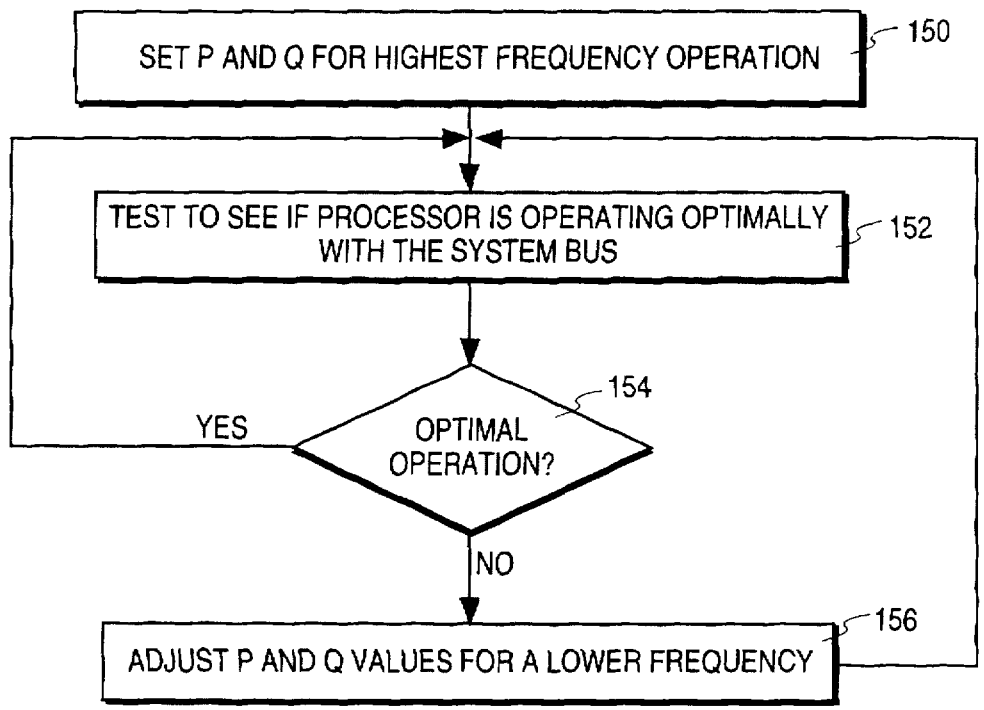
FIG. 1D illustrates an algorithm for selecting P/Q.

The values of P and Q can be programmed, set, or selected in a variety of ways. For example, FIG. 1A illustrates a P/Q selector 128 for selecting the values of P and Q comprising programmable pins 126. FIG. 1B illustrates a P/Q selector 136 comprising a P register and a Q register. FIG. 1C illustrates a P and Q selection state machine 140 for selecting the values of P and Q. FIG. 1D illustrates an algorithm for selecting the values of P and Q. This algorithm can be executed by a processor or a state machine. For example, a processor may power on with default P and Q values to operate at its highest possible frequency and iteratively select P and Q values for optimal operation with the system bus.

Refer again to FIG. 1. A sync generator 11 generates a Sync signal that indicates a predetermined phase relationship of the high and low frequency clocks. In one mode, the sync generator 11 is a phase detector circuit that receives the high and low frequency clocks and generates the Sync signal when the predetermined phase relationship is detected. The Sync signal can be asserted at various times to indicate the predetermined phase relationship. In one mode, the Sync signal is asserted during the high frequency clock cycle before coincident rising edges of the high and low frequency clocks. In one mode, the Sync signal is generated for each occurrence of the predetermined phase relationship. In another mode, the Sync signal is generated only upon a first occurrence of the predetermined phase relationship. In one mode the predetermined phase relationship is a coincident edge of the high and low frequency clocks. In other modes, the Sync signal indicates other coincident edges or phase relationships of the high and low frequency clocks and is asserted at other times to so indicate.

A high frequency device 16 operates responsive to the high frequency clock and exchanges data with other devices via its data input and data output terminals (DataIN and DataOUT, respectively). A low frequency device 18 operates responsive to the low frequency clock and also exchanges data via its own data input and data output terminals (also DataIN and DataOUT, respectively). The data input and output terminals of the high and low frequency devices are coupled to a data qualifier 14. In one mode, the high and low frequency devices are combinational logic devices. In another mode, the high and low frequency devices are discrete logic devices. In another mode, the high and low frequency devices are processors. In another mode, the high and low frequency devices are different functional blocks of a microprocessor, such as a CPU and a cache memory or a CPU and a floating point unit. In another mode, the high and low frequency devices are a CPU and a cache memory on separate chips. In yet another mode, the high frequency device is a processor and the low frequency device is a peripheral device and system bus of a computer system.

The data qualifier 14 couples the input and output terminals of the high frequency device to the output and input terminals, respectively, of the low frequency device and enables transfer of data between the high and low frequency devices. The data qualifier 14 enables the transfer of data from the high frequency device to the low frequency device in response to a high-to-low data transfer signal, H-->L_en, and from the low frequency device to the high frequency device in response to a low-to-high data transfer signal, L-->H_en. The H-->L_en and L-->H_en data transfer signals are coupled to the en1 and en2 inputs, respectively, of the data qualifier 14. In one mode, the data qualifier 14 comprises transfer gates for transferring data in response to the data transfer signals. In another mode, the data qualifier 14 comprises logic gates, such as AND gates, for qualifying transfer data with the data transfer signals. In another mode, the data qualifier 14 comprises latches that latch input and output data in response to the data transfer signals. In yet another mode, the data qualifier 14 comprises latches that are enabled by the data transfer signals and responsive to one of the clocks.

An interface controller 12 receives the P and Q values, the high frequency clock and the Sync signal and, responsive to these inputs, generates the H-->L_en and L-->H_en data transfer signals for enabling synchronous data transfers from the high to low and from the low to high frequency domains, respectively. In one mode, the interface controller is a state machine. In another mode, the interface controller is a processor. In yet another mode, the interface controller is combinational logic. When active, the data transfer signals indicate safe data transmission times, or windows, for synchronously transferring data between the high and low frequency devices. In one mode, a safe data transmission time is when the data in the sending frequency domain is known to be stable and when the receiving device in the receiving frequency domain can receive the data.

FIG. 2 illustrates one mode of the L-->H_en signal generated by the interface controller 12 of FIG. 1. In this mode, the L-->H_en signal is active during selected high frequency clock cycles during which there is no rising edge (i.e., data changing edge) of the low frequency clock. Data in the low frequency domain changes responsive to rising edges of the low frequency clock. It is safe to transfer data from the low to high frequency domain during active L-->H_en because the low frequency domain data is stable during that period of time and the high frequency device can receive the data during that high frequency clock cycle. In another mode, the low frequency domain data changes responsive to falling edges of the low frequency clock and the L-->H_en signal is active during selected high frequency clock cycles during which there is no falling edge of the low frequency clock. In another mode, the L-->H_en signal is active during selected high frequency clock cycles during which there is no data changing edge of the low frequency clock. In one mode, the transfer of data is also qualified by a read or write signal.

FIG. 3 illustrates one mode of the H-->L_en signal generated by the interface controller 12 of FIG. 1. In this mode, the H-->L_en signal is active during the high frequency clock cycle immediately prior to a rising edge (i.e., a data receiving edge) of the low frequency clock. Data to be transferred by the high frequency device is latched, in response to the H-->L_en signal, for subsequent transfer to the low frequency device. The data is then latched or received by the low frequency device on the next rising edge of the low frequency clock. In one mode, the transfer of data is also qualified by a read or write signal. In another mode, the H-->L_en data transfer signal may also be active for more than one high frequency clock cycles immediately prior to a receiving edge of the low frequency clock. This mode allows extra time for data from the high frequency domain to stabilize before being received by the low frequency device. In another mode, the H-->L_en data transfer signal may be active during a data receiving edge of the low frequency clock. In yet another mode the receiving edge of the low frequency clock is a falling edge. In another mode, the H-->L_en signal may be active during high frequency clock cycles during which there are no data changing or data receiving edges of the low frequency clock.

Figure 4:
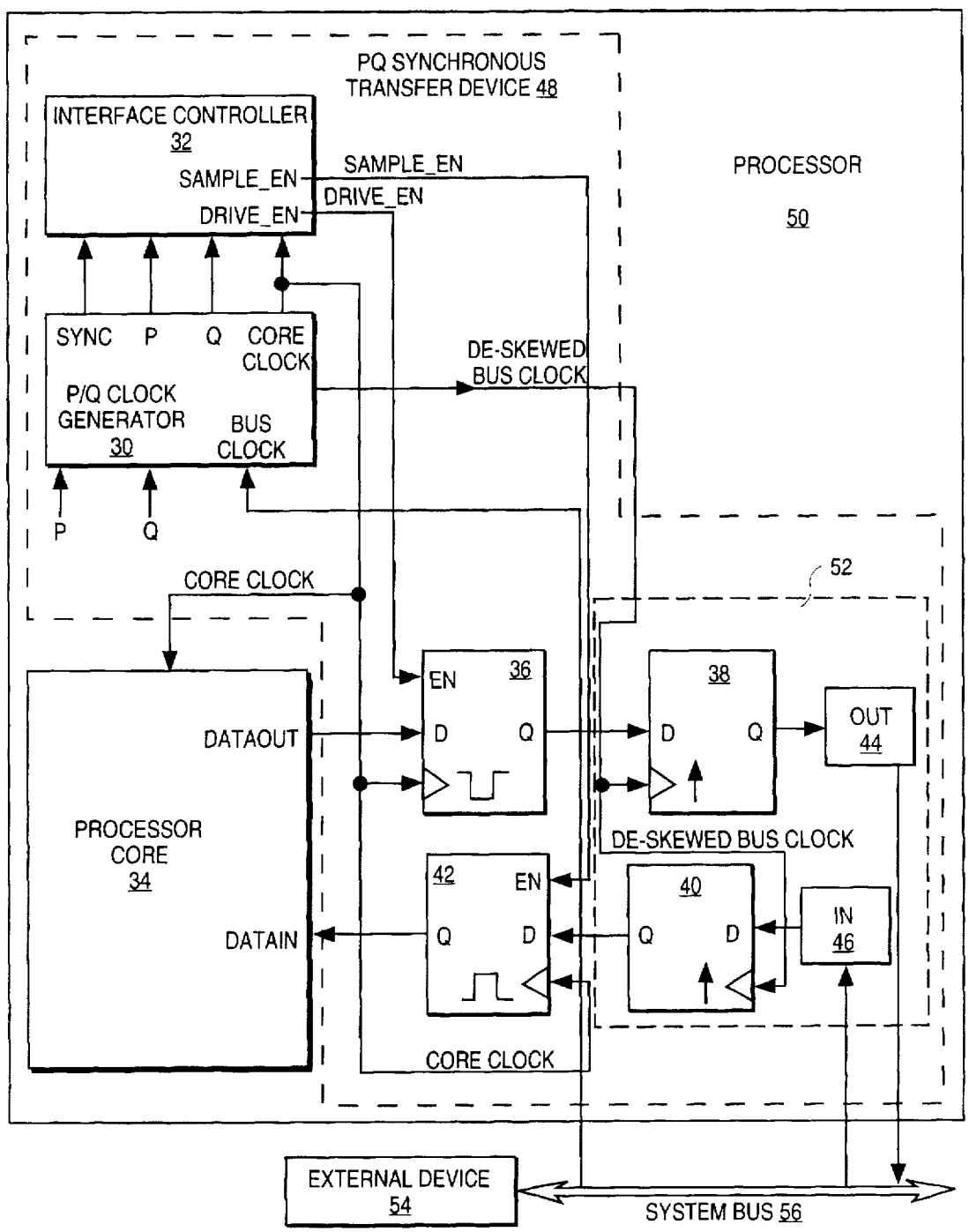
FIG. 4 is a block diagram of an embodiment of the present invention apparatus in the processor of a computer system.

FIG. 4 is a block diagram of a particular implementation of the present invention apparatus in a processor 50 of a computer system. This embodiment, as contrasted with the embodiment of FIG. 1, is described in terms associated with microprocessors and computers. For example, the low-to-high and high-to-low data transfer signals of FIG. 1 are here described as sample_en and drive_en signals to reflect the processor functions of sampling and driving data on its I/O pads. The processor 50 is coupled to a system bus 56 to communicate with external devices represented by an external device 54. The external device 54 operates responsive to a bus clock that may be part of the system bus 56. In one mode, the bus clock is generated by the processor 50. In another mode the bus clock is generated externally and input to the processor 50.

The processor 50 includes a P/Q synchronous transfer device 48 for providing synchronous data transfer between a high frequency processor core 34 and the low external device 54 via system bus 56. The P/Q synchronous transfer device includes system bus interface logic 52. In another embodiment, the system bus interface logic 52 is part of the external device 54. In yet another embodiment, the system bus interface logic 52 is part of a separate device external to the processor 50. The system bus interface logic 52 operates responsive to a de-skewed low frequency bus clock. The high frequency processor core 34 operates responsive to a high frequency core clock. The de-skewed bus clock has the same frequency as the bus clock and has the same phase as the core clock. The frequency relationship of the bus and core clocks is the integer ratio relationship defined below in EQ. 2. The de-skewed bus clock allows simpler logic design. In another embodiment, the bus clock is used in place of the de-skewed bus clock.

The processor 50 includes a P/Q clock generator 30 that receives a P value and a Q value and generates one or more clocks and a Sync signal. In one mode, the P/Q clock generator 10 receives a bus clock as an input and generates a core clock. In this mode, the P/Q clock generator 30 may be a phase-locked loop. In another mode the P/Q clock generator 30 receives the core clock and generates the bus clock. In yet another mode, the P/Q clock generator 30 generates both the bus and core clocks. In one mode, the P/Q clock generator 30 generates a de-skewed bus clock that has the same phase as the core clock. In one mode, the P/Q clock generator 30 generates a de-skewed bus clock that has the same phase as the bus clock. The frequencies of the core and bus clocks have an integer ratio relationship, P/Q, that is determined by the two values P and Q as defined by equation 2:

Bus Clock Frequency=(P/Q)×Core Clock Frequency    (EQ. 2)

where P and Q represent integer values of the integer ratio P/Q. In one mode, P is less than Q such that the bus clock frequency is lower than the core clock frequency. In another mode, P is greater than Q such that the bus clock frequency is higher than the core clock frequency. The values of P and Q may be set in a variety of ways (see FIGS. 1A–1D). In one mode, the P and Q values are set by pins of the processor 50. In another mode, the P and Q values are set by writing values to a register of the processor 50. In yet another mode, P and Q are set by an algorithm. For example, processor 50 may power on with default P and Q values to operate at its highest possible core and iteratively select P and Q values for optimal operation with the system bus. Such an algorithm can be implemented in a software routine executed by the processor, in the system BIOS, or by hardware state machine of the processor.

The Sync signal indicates a predetermined phase relationship of the clocks. In one mode, the Sync signal indicates substantially coincident rising edges of the core and bus clocks. In another mode, the Sync signal indicates substantially coincident rising edges of the core and de-skewed bus clocks. In other modes, the Sync signal indicates other predetermined phase relationships between the clocks. The Sync signal can indicate the predetermined phase relationship in various ways. In one mode, to indicate coincident edges the Sync signal is asserted during the core clock cycle immediately prior to coincident data changing edges of the core clock and the de-skewed bus clock. In one mode, the Sync signal is generated for each occurrence of the predetermined phase relationship. In another mode, the Sync signal is generated only upon a first occurrence of the predetermined phase relationship. In other modes, the Sync signal indicates other coincident edges of the clocks and is asserted at other times to so indicate.

The processor 50 also includes an interface controller 32. The interface controller 32 receives the P and Q values, the core clock, and the Sync signal and, responsive to these inputs, generates two data transfer signals, sample_en and drive_en, that respectively enable input and output data transfers of the processor 50. In one mode, the interface controller is a state machine. In another mode, the interface controller is a processor. In yet another mode, the interface controller is combinational logic. When active, the data transfer signals indicate safe data transmission times, or windows, for the processor 50 to synchronously sample or drive data on its input 46 or output 44 pads, respectively. In another mode, a single I/O pad may be used in place of the separate input and output pads. For data input purposes, safe data transmission times are when input data is stable and the latch 42 can receive the data. For data output purposes, safe data transmission times are when output data is stable and the latch 38 is ready to receive the data.

The processor 50 includes a processor core 34 that operates responsive to the core clock to process data and instructions and synchronously exchange data with the external device 54 via the system bus 56. A set of latches 36, 38, 40 and 42, are coupled between the processor core 34 and the system bus 56 to facilitate synchronous data exchange between the processor core 34 and the external device 54. Latch 36 is coupled to receive data from a data output terminal, DataOUT, of the processor core 34. Enable and clock inputs of latch 36 are coupled to the drive_en and core clock signals, respectively. In one mode, latch 36 is a transparent D-latch that is transparent during the low period of the core clock if the enable input is active. In another mode, latch 36 is an edge-triggered D-latch. The output of latch 36 is coupled to the input of latch 38. A clock input of latch 38 is coupled to the de-skewed bus clock. In one mode, latch 38 is an edge-triggered latch responsive to the rising edge of the de-skewed bus clock. In another mode, latch 38 is a transparent D-latch. The output of latch 38 is coupled to the output pad 44. In another mode, a de-skewed bus clock is not generated and the clock input of latch 38 is coupled to the bus clock.

Latch 40 is coupled to receive data from the input pad 46. A clock input of latch 40 is coupled to the de-skewed bus clock. In one mode, latch 40 is an edge-triggered D-latch responsive to the rising edge of the de-skewed bus clock. In another mode, the latch 40 is a transparent D-latch. In another mode, a de-skewed bus clock is not generated and the clock input of latch 40 is coupled to the bus clock. Latch 42 is coupled to receive the output of latch 40. Enable and clock inputs of latch 42 are coupled to the sample_en and core clock signals, respectively. In one mode, latch 42 is a transparent D-latch that is transparent during the high period of the core clock if the enable input is active. In another mode, latch 42 is an edge-triggered D-latch. The output of latch 42 is coupled to a data input terminal, DataIn, of the processor core 34.

Figure 5:
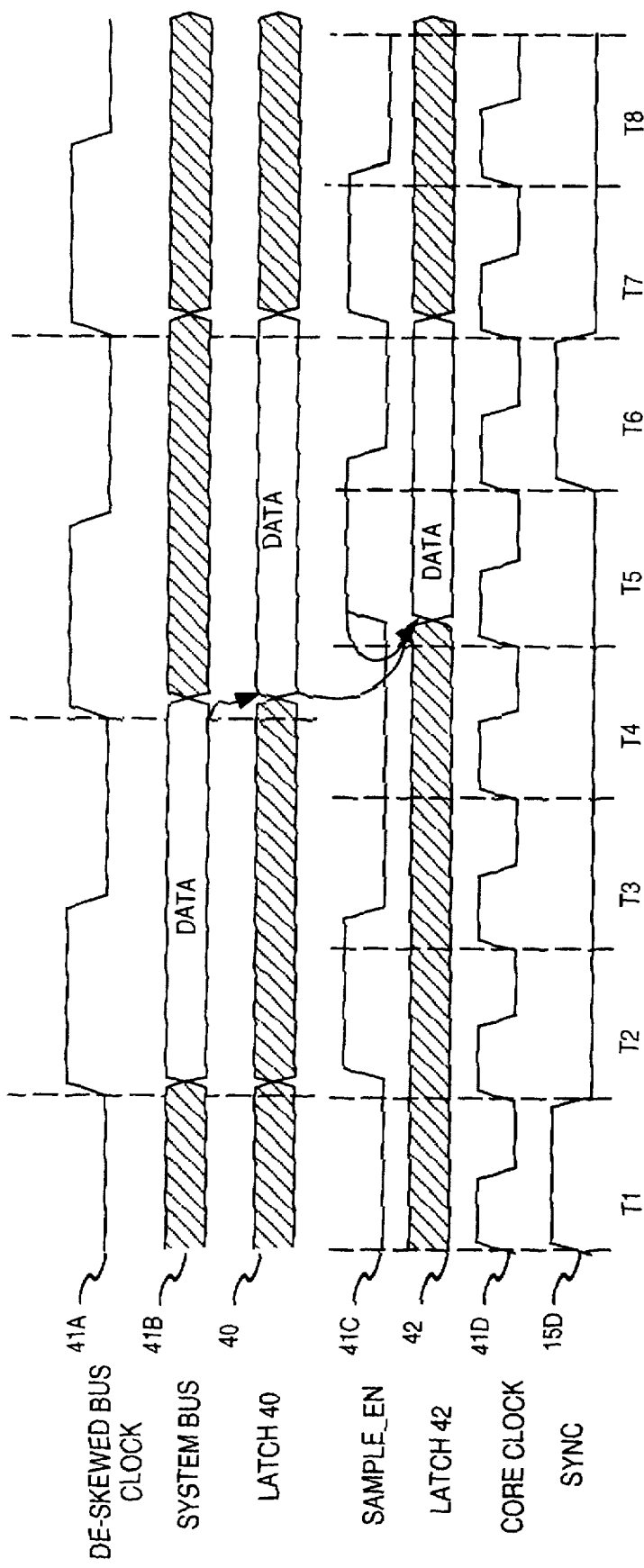
FIG. 5 is a set of waveforms illustrating one mode of operation of the embodiment of FIG. 4 in transferring data from the system bus to the processor.

FIG. 5 is a set of waveforms illustrating one mode of operation of the processor 50 of FIG. 4 in inputting data from the system bus 56 to the processor core 34. During T1, the Sync signal is high to indicate that the next rising edge of the de-skewed bus clock (or bus clock) corresponds to a rising edge of the core clock. During T2, T3, and T4 the external device 54 drives input data on the system bus 56. During T4, in response to the rising edge of the de-skewed bus clock, latch 40 latches the input data. During T5, the sample_en signal is active indicating that it is safe to latch input data (i.e., the input data is stable). In response to the active sample_en signal and the high period of the core clock, latch 42 latches the input data from latch 40. The output of latch 42 is provided to the DataIN terminal of the processor core 34.

Figure 6:
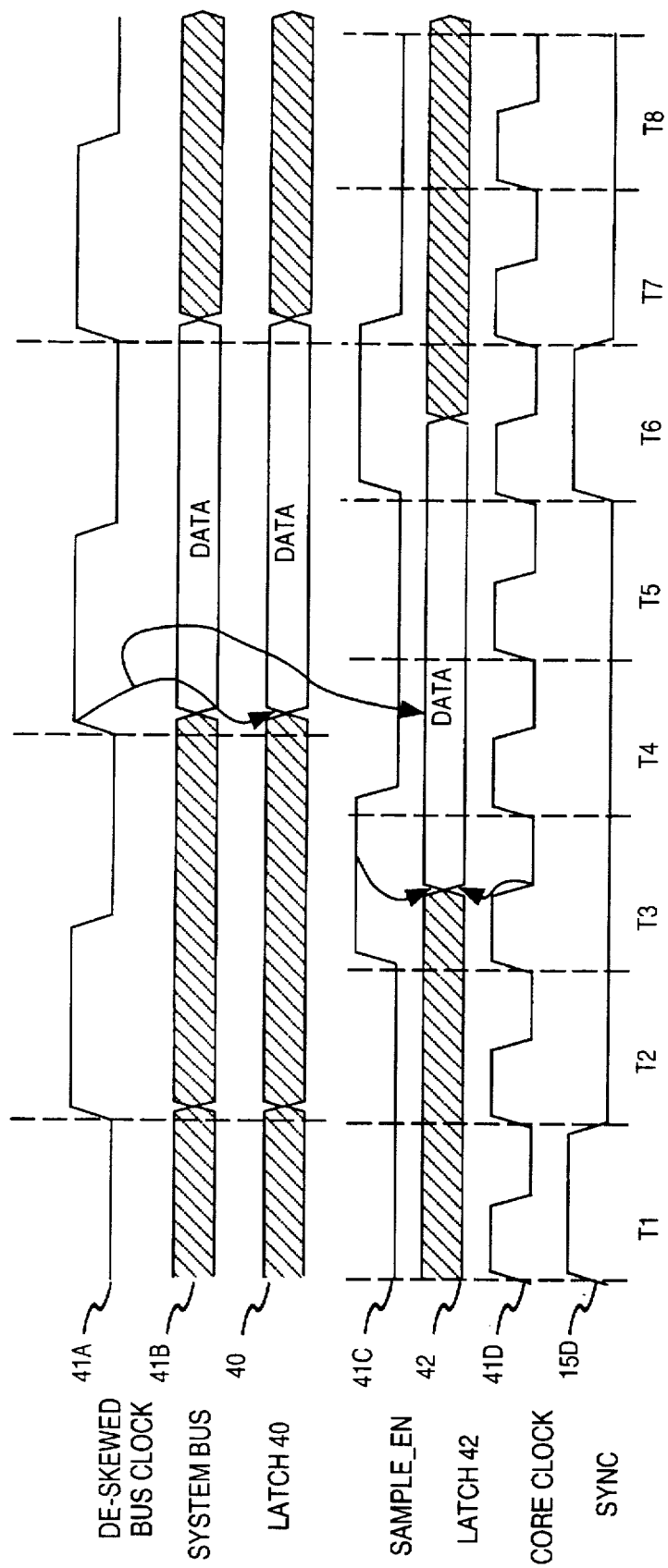
FIG. 6 is a set of waveforms illustrating one mode of operation of the embodiment of FIG. 4 in transferring data from the processor to the system bus.

FIG. 6 is a set of waveforms illustrating one mode of operation of the processor 50 of FIG. 4 in outputting data from the processor core 34 to the system bus 56 for use by the external device 54. During T1, the Sync signal is high to indicate that the next rising edge of the de-skewed bus clock (or bus clock) corresponds to a rising edge of the core clock. During T3, drive_en is active indicating a safe time to latch output data for subsequent transfer to the output pad 44. During T3, in response to the active drive_en signal and the low period of the core clock, latch 36 latches output data from the processor core's DataOUT terminal. Latch 36 drives the latched data on its output terminal as input to latch 38. During T4, in response to the rising edge of the bus clock, latch 38 latches and drives the output data to the system bus 56 for use by the external device 54.

Figure 7:
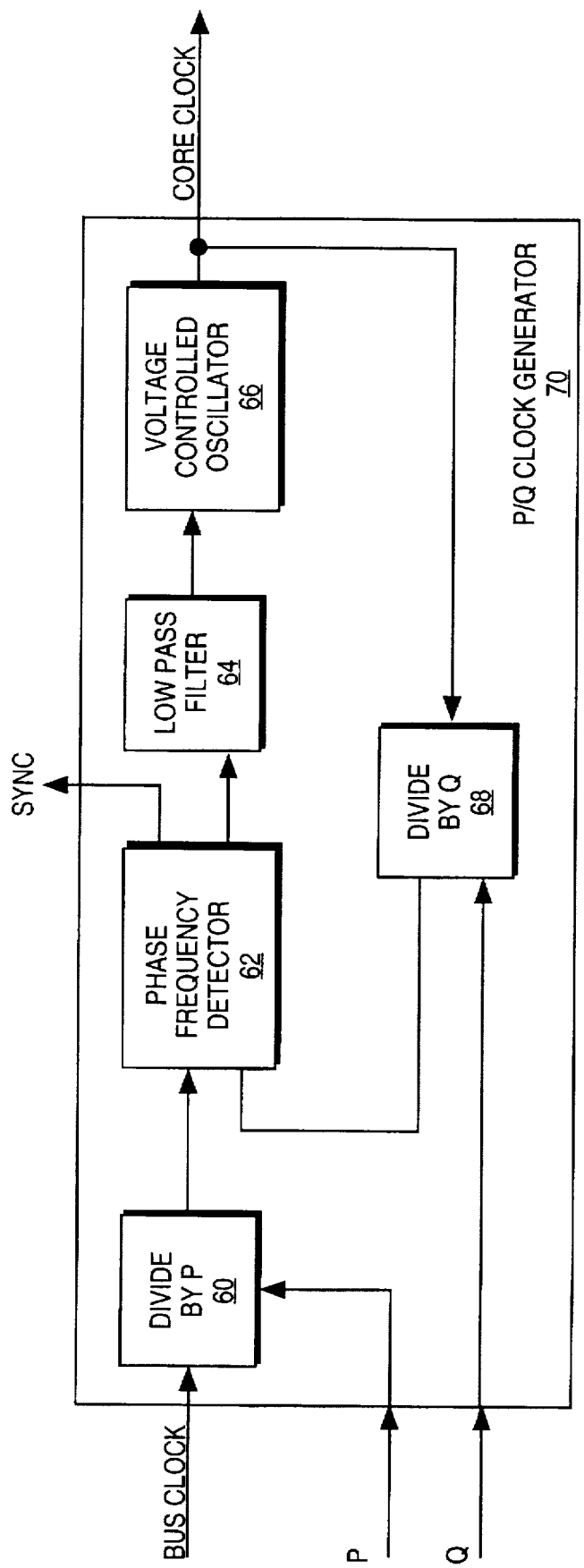
FIG. 7 is a block diagram of one embodiment of the P/Q clock generator.

FIG. 7 is a block diagram of one embodiment of the P/Q Clock Generator. The P/Q clock generator 70 comprises a divide-by-P frequency divider 60 and a frequency multiplying phase-locked loop that includes block 62, 64, 66, and 68. The divide-by-P frequency divider 60 receives the value of P and the bus clock and generates an output signal that has a frequency of (bus clock)/P. In one mode, the divide-by-P frequency divider is a programmable counter. In another mode, the divide-by-P frequency divider is a master-slave divider circuit. A phase-frequency detector 62 receives the (bus clock)/P signal and a (core clock)/Q output from a divide-by-Q block 68 and generates a phase error signal and a Sync signal. The phase error signal indicates whether there is a phase or frequency difference between the two input signals. In one mode, the Sync signal indicates coincident rising edges of the two input signals. In other modes, the Sync signal indicates other predetermined phase relationships of the two input signals. A low pass filter 64 receives the phase error signal and generates a control voltage signal. The control voltage signal drives a voltage controlled oscillator 66. In response to the control voltage, the voltage controlled oscillator 66 generates an output clock signal (Core Clock) whose frequency is determined by the control voltage. The value of Q and the core clock is received by a divide-by-Q frequency divider 68 which generates the (core clock)/Q signal. In one mode, the divide-by-Q frequency divider is a programmable counter. In another mode, the divide-by-Q frequency divider is a master-slave divider circuit. The action of the phase-locked loop is to adjust the frequency of the voltage controlled oscillator 66 such that the (core clock)/Q feedback signal has the same phase and frequency as the (bus clock)/P signal. Therefore, the frequency of the core clock signal is Q/P times the frequency of the bus clock signal. Or, alternatively, the frequency of the bus clock is P/Q times the frequency of the core clock. In one mode, P is smaller than Q such that the bus clock frequency is lower than the core clock frequency.

Figure 8:
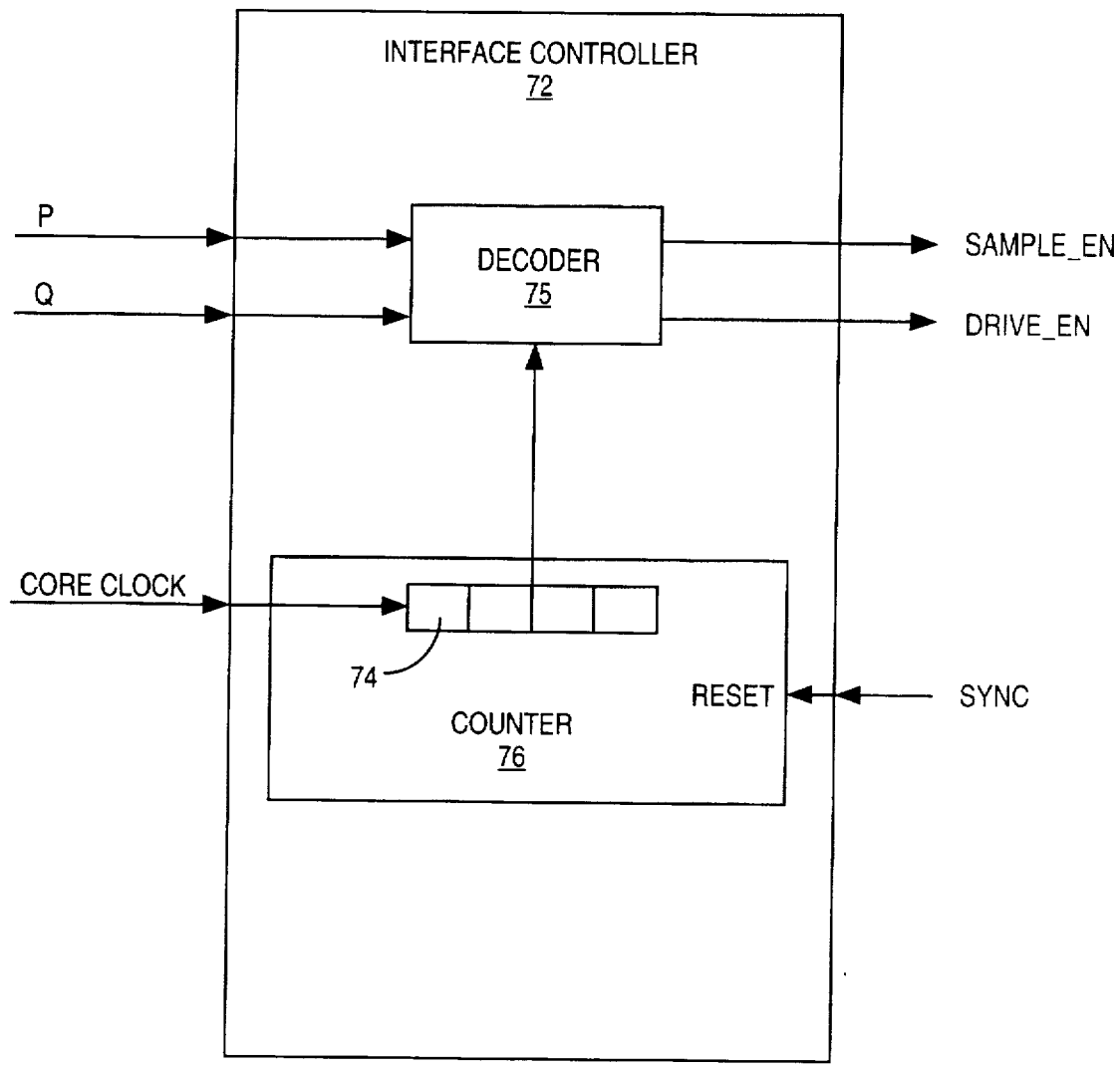
FIG. 8 is a block diagram of one embodiment of the interface controller.

FIG. 8 is a block diagram of one embodiment of the interface controller. The interface controller 72 includes a counter 76 having a four-bit counter register 74 that is incremented by the core clock and reset by the Sync signal. In one mode, the counter 76 is implemented with combinational logic. A decoder 75 receives the counter register value and the P and Q values as inputs and decodes them to generate the sample_en and drive_en data transfer signals. In one mode, the decoder is implemented with combinational logic. In another mode, the decoder is a processor. In another mode, the decoder is a state machine.

The P and Q integer values can be encoded in various ways. For example, in one mode the interface controller uses the P and Q encodings defined in Table 1.

TABLE 1

| Integer Value | Binary Encoding |
| --- | --- |
| P = 3 | 0 |
| P = 4 | 1 |
| Q = 8 | 000 |
| Q = 9 | 001 |
| Q = 10 | 010 |
| Q = 11 | 011 |
| Q = 12 | 100 |
| Q = 13 | 101 |
| Q = 14 | 110 |
| Q = 15 | 111 |

In one mode, the interface controller generates the sample_en and drive_en outputs for P and Q encodings of [P=4, Q=8] and [P=4, Q=9] as shown in Table 2.

TABLE 2

| P | Q | Counter | sample en | drive en |
| --- | --- | --- | --- | --- |
| 1 | 000 | 0000 | 1 | 0 |
| 1 | 000 | 0001 | 0 | 1 |
| 1 | 001 | 0001 | 0 | 1 |

TABLE 2-continued

| P | Q | Counter | sample en | drive en |
|---|---|---------|-----------|----------|
| 1 | 001 | 0010 | 0 | 0 |
| 1 | 001 | 0011 | 1 | 1 |
| 1 | 001 | 0000 | 1 | 0 |
| 1 | 001 | 0100 | 0 | 0 |
| 1 | 001 | 0101 | 1 | 1 |
| 1 | 001 | 0110 | 0 | 0 |
| 1 | 001 | 0111 | 1 | 0 |
| 1 | 001 | 1000 | 0 | 1 |
| . | ... | .... | . | . |

FIGS. 8A–8H illustrate waveforms of the sample_en and drive_en signals, as generated by the interface controller, in one mode, for [P=4, Q=8] (FIG. 8A) through [P=4, Q=15] (FIG. 8H).

Figure 9:
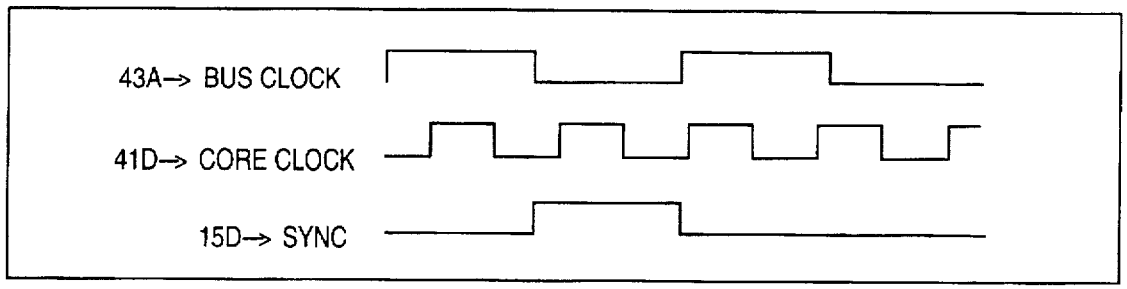
FIG. 9 is a set of waveforms illustrating one mode of the Sync signal.

FIG. 9 illustrates one mode of the Sync signal generated by the P/Q clock generator. In this mode, the Sync signal is asserted in the bus clock (i.e., high frequency clock) period before the coincident rising edges of the bus and core clocks (i.e., high and low frequency clocks). In one mode, the Sync signal is generated for each occurrence of the coincident rising edges. In another mode, the Sync signal is generated only upon a first coincident rising edge. In other modes, the Sync signal is asserted corresponding to other coincident edges of the high and low frequency clocks and asserted at other times to so indicate.

Figure 10:
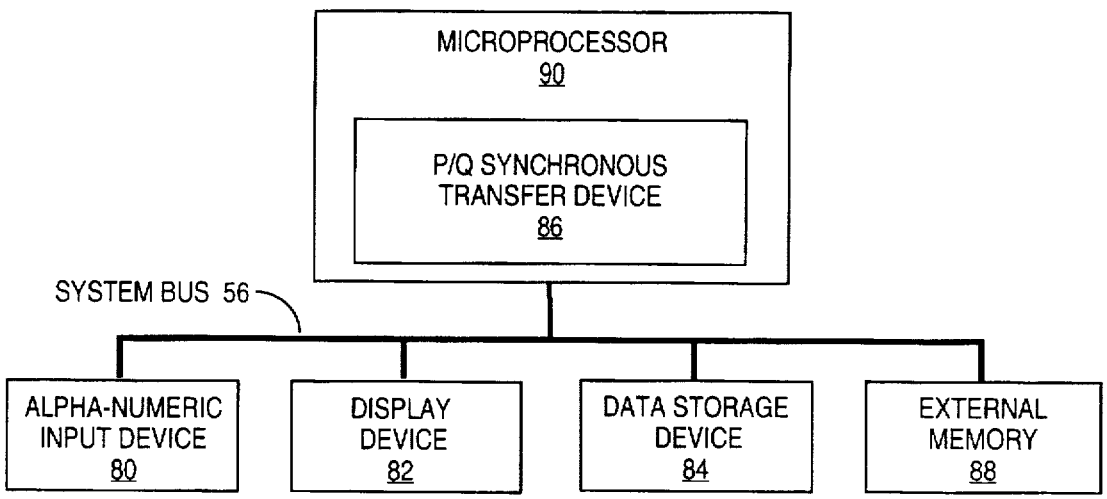
FIG. 10 illustrates an embodiment of the present invention apparatus in the microprocessor of a computer system.

FIG. 10 illustrates an embodiment of the present invention apparatus in a computer system. A microprocessor 90 that operates responsive to the higher frequency core clock is coupled to a system bus 56. The system bus comprises the address, data, and control lines necessary for transferring data between the various blocks of the system. In one mode, the lower frequency bus clock is also part of the system bus 56. An external memory 88 for storing instructions and data used by the microprocessor 90, an alphanumeric input device 80 for allowing a computer user to communicate information and commands to the microprocessor 90, a display device 82 for displaying information to the computer user, and a data storage device 84 such as a hard disk for storing information are also coupled to the system bus 56. Information is transferred on the system bus 56 at the bus clock frequency. One or more of the devices coupled to the system bus 56 operate responsive to the bus clock. Because microprocessor 90 operates according to a high frequency internal core clock microprocessor 90 includes a P/Q synchronous transfer device 86 for providing synchronous data transfer between the microprocessor 90 and other devices coupled to the system bus 56. The present invention apparatus allows the high frequency microprocessor to synchronously exchange data with the low frequency components of the computer system. It should be understood that not all of the shown components are necessary for a given computer system implementation. It should also be understood that additional components may be present in a given computer system. In one mode, the microprocessor 90 is the microprocessor 50 of FIG. 4.

The present invention provides greater flexibility in choosing the bus and core clock frequencies in the design of computer systems while also providing synchronous data transfer. For example, today's system board designs are optimized for either 50 or 66 MHz operation. In one mode, for both 50 and 66 MHz system board designs the present invention provides synchronous data transfer for the P/Q values and corresponding microprocessor frequencies defined in Table 3. The microprocessor frequencies are shown in the top row of Table 3 with the P/Q values in the left column. The corresponding bus frequencies are shown in the body of Table 3.

TABLE 3

P/Q, CPU FREQUENCY, AND BUS FREQUENCY COMBINATIONS

| P/Q values | CPU Freqs | | | | | |
|---|---|---|---|---|---|---|
|  | 133 MHz | 150 MHz | 166 MHz | 183 MHz | 200 MHz | 216 MHz |
|  | Bus Frequencies corresponding to CPU Frequencies and P/Q values | | | | | |
| 4/8 | 66 MHz | | | | | |
| 4/9 |  | 66 MHz | | | | |
| 4/10 |  |  | 66 MHz | | | |
| 4/11 |  |  |  | 66 MHz | | |
| 4/12 |  |  |  |  | 66MHz | |
| 4/13 |  |  |  |  |  | 66 MHz |
| 3/8 | 50 MHz | | | | | |
| 3/9 |  | 50MHz | | | | |
| 3/10 |  |  | 50 MHz | | | |
| 3/11 |  |  |  | 50 MHz | | |
| 3/12 |  |  |  |  | 50 MHz | |
| 3/13 |  |  |  |  |  | 50 MHz |

In other modes, other board frequencies, P/Q combinations, and microprocessor frequencies may be used.

Figure 11:
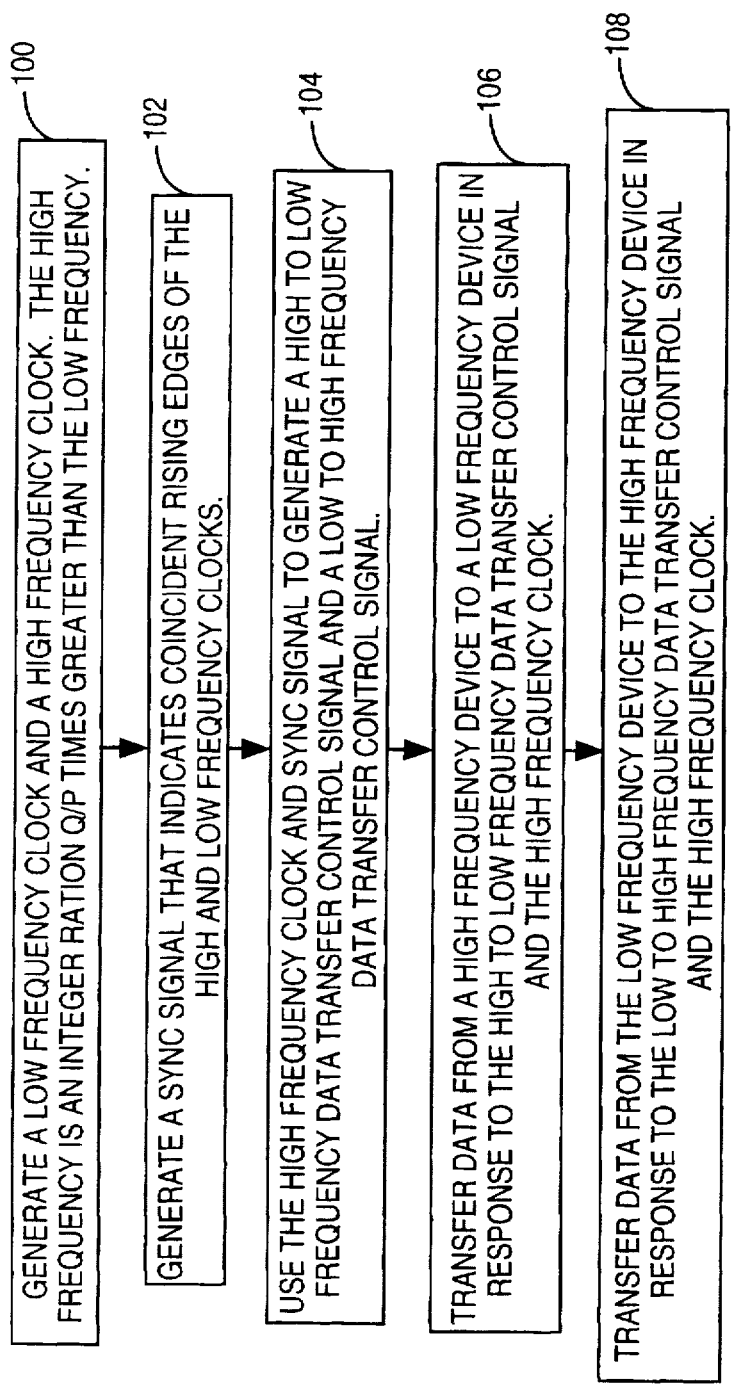
FIG. 11 is a flowchart of the present invention method for synchronously transferring data between devices operating at different frequencies.

FIG. 11 is a flowchart of the present invention method for synchronously transferring data between digital devices operating at P/Q related frequencies. Step 100 generates the low frequency clock and the high frequency clock that have the frequency relationship of equation 1 above. In one mode, the clocks are generated by the P/Q clock generator described above. Step 102 generates the Sync signal to indicate a predetermined phase relationship of the high and low frequency clocks. In one mode, the Sync signal indicates coincident rising edges of the clocks. In other modes, the Sync signal indicates other coincident edges of the high and low frequency clocks. In one mode, the Sync signal is generated by the P/Q clock generator described above. In another mode, a separate phase-detection circuit generates the Sync signal. Step 104 generates a high-to-low data transfer signal (such as H-->L_en of FIG. 1) and a low-to-high data transfer signal (such as L-->H_en of FIG. 1) in response to the Sync signal and the high frequency clock. When active, the data transfer signals qualify safe data transmission times for enabling synchronous data transfer between devices operating in the high and low frequency domains. Generally, a safe data transmission time, or window, is a time when the data in the sending frequency domain is known to be stable and when the receiving device in the receiving frequency domain can receive the data. In one mode, the data transfer signals are generated by the interface controller described above. In step 106, a data qualifer enables transfer of data from a high frequency device (operating in response to the high frequency clock) to a low frequency device (operating in response to the low frequency clock in response to the high-to-low data transfer signal and the high frequency clock. In step 108, the data qualifier enables transfer of data from the low frequency device to the high frequency device in response to the low-to-high data transfer signal and the high frequency clock.

Thus, a system, method, and apparatus for providing synchronous data transmission between digital devices operating at frequencies having a P/Q integer ratio relationship has been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather that a restrictive sense.

What is claimed is:

1. An apparatus for use with a high frequency device which operates according to a high frequency clock and also for use with a low frequency device which operates according to a low frequency clock having a frequency substantially P/Q times the high frequency clock, wherein P and Q are integers having predetermined values and P is less than Q, the apparatus comprising:

means for detecting an occurrence of a predetermined phase relationship of the high and low frequency clocks, and for asserting a sync signal in response to the occurrence of the predetermined phase relationship;

means, coupled to receive and responsive to the sync signal and the high frequency clock, for generating a first transfer signal indicating a safe transfer window according to P and Q and the occurrence of the predetermined phase relationship;

means, coupled to receive and responsive to the first transfer signal, for providing synchronous transmission and reception of data between the high and low frequency devices; and means, coupled to the first transfer signal generating means, for switching Q between a first plurality of values, and wherein the determining means and the first transfer signal generating means are operable for Q being any of the first plurality of values.

2. The apparatus of claim 1 wherein the safe transfer window is at least one period of the high frequency clock when the data to be transferred is stable and the device receiving the data is capable of receiving the data.

3. The apparatus of claim 2 wherein the predetermined phase relationship is a substantially coincident edge of the high and low frequency clocks.

4. An apparatus for use with a high frequency device which operates according to a high frequency clock and also for use with a low frequency device which operates according to a low frequency clock having a frequency substantially P/Q times the high frequency clock, wherein P and Q are integers having predetermined values and wherein P is less than Q and Q is not an integer multiple of P, the apparatus comprising:

means for detecting an occurrence of substantially coincident edges of the high and low frequency clocks, and for asserting an occurrence signal in response to the occurrence of the substantially coincident edges;

means, coupled to receive and responsive to the occurrence signal and the high frequency clock, for generating a first transfer signal during a safe transfer window according to P and Q and the occurrence of the substantially coincident edges, wherein the safe transfer window is at least one period of the high frequency clock when the data to be transferred is stable and the device receiving the data is capable of receiving the data; and means, coupled to receive and responsive to the first transfer signal, for providing synchronous transfer of data from one of the high and low frequency devices to the other.

5. The apparatus for claim 4 further comprising:

means, coupled to the first transfer signal generating means, for selecting the values of P and Q.

6. The apparatus of claim 5 wherein the P and Q selector means comprises programmable pins of the apparatus.

7. The apparatus of claim 5 wherein the P and Q selector means comprises a register of the apparatus.

8. The apparatus of claim 5 wherein the first transfer signal generator means includes:

counter means for generating a count value responsive to the high frequency clock and for resetting the count value to a predetermined count value responsive to the assertion of the occurrence signal by the detecting means; and decoder means, coupled to the counter means, for decoding the count value and the values of P and Q and for generating the first transfer signal according to predetermined combinations of P and Q and the count value.

9. An apparatus for use with a first device and a second device which respectively operate according to a first clock having a first frequency and a second clock having a second frequency substantially equal to P/Q times the first frequency, wherein P and Q are integers having predetermined values and P is less than Q, the apparatus comprising:

a phase detector, coupled to receive and responsive to the first and second clocks, that generates an occurrence signal to indicate an occurrence of a predetermined phase relationship of the first and second clocks;

an interface controller, coupled to receive and responsive to the occurrence signal and the first clock, that generates a first transfer signal during a first safe transfer window according to P and Q and the occurrence of the predetermined phase relationship;

a data qualifier, coupled to receive the first transfer signal, that provides synchronous transmission and reception of data between the first and second devices in response to the generation of the first transfer signal; and a Q selector, coupled to the interface controller, configured to switch Q between a first plurality of values, wherein the phase detector and the interface controller are operable for Q being any one of the first plurality of values.

10. The apparatus of claim 9 wherein a first safe transfer window is at least one period of the first clock when the data to be transferred is stable and the device receiving the data is capable of receiving the data.

11. The apparatus of claim 9 wherein the predetermined phase relationship is a substantially coincident edge of the first and second clocks.

12. An apparatus for use with a first device and a second device which respectively operate according to a first clock having a first frequency and a second clock having a second frequency substantially equal to P/Q times the first frequency, wherein P and Q are integers having predetermined values and wherein P is less than Q and Q is not an integer multiple of P, the apparatus comprising:

a phase detector, coupled to receive and responsive to the first and second clocks, that generates a sync signal to indicate an occurrence of substantially coincident edges of the first and second clocks;

an interface controller, coupled to receive and responsive to the sync signal and the first clock, that generates a first transfer signal during a first safe transfer window according to P and Q, wherein the first safe transfer window is at least one period of the first clock when the data to be transferred is stable and the device receiving the data is capable of receiving the data; and a data qualifier, coupled to receive the first transfer signal, that provides synchronous transfer of data from one of the first and second devices to the other in response to the generation of the first transfer signal.

13. The apparatus of claim 12 further comprising:
a P selector, coupled to the interface controller, that selects the value of P; and
a Q selector, coupled to the interface controller, that selects the value of Q.

14. The apparatus of claim 12 wherein the interface controller is configured to generate a second transfer signal during a second safe transfer window, wherein the second safe transfer window is at least one period of the first clock when the second device provides stable second data and the first device is capable of receiving the second data.

15. The apparatus of claim 14 wherein the data qualifier provides synchronous transfer of data from the first device to the second device in response to the generation of the first transfer signal and provides synchronous transfer of data from the second device to the first device in response to the generation of the second transfer signal.

16. The apparatus of claim 14 wherein the interface controller includes:
a counter that generates a count value responsive to the first clock and resets the count value to a predetermined count value responsive to the generation of the sync signal; and
a decoder, coupled to the counter, that decodes the count value and the values of P and Q and generates the first transfer signal according to first predetermined combinations of P and Q and the count value and generates the second transfer signal according to second predetermined combinations of P and Q and the count value.

17. A computer system comprising:
a system bus for providing a communication interface;
a low frequency device, coupled to the system bus and responsive to a second clock, for sending and receiving data via the system bus; and
a processor, coupled to the system bus and responsive to a first clock having a frequency substantially Q/P times the second clock, wherein Q and P are integers having predetermined values and P is less than Q, for executing the instructions and sending and receiving data via the system bus, the processor having an apparatus for providing synchronous data transmission between the processor and the low frequency device, the apparatus including:
a phase detector, coupled to receive and responsive to the first and second clocks, and being configured to generate a sync signal to indicate an occurrence of a predetermined phase relationship of the first and second clocks;
an interface controller, coupled to receive and responsive to the sync signal and the first clock, configured to generate a first transfer signal during a first safe transfer window according to P and Q;
a data qualifier coupled to receive the first transfer signal, and being configured to provide synchronous transmission and reception of data between the processor and the low frequency device in response to the first transfer signal; and
a Q selector coupled to the interface controller for switching Q between a first plurality of values, wherein the phase detector and interface controller are operable for Q being any of the first plurality of values.

18. The computer system of claim 17 wherein the predetermined phase relationship is a substantially coincident edge of the first and second clocks.

19. A method for transferring data between a high frequency device which operates according to a high frequency clock and a low frequency device which operates according to a low frequency clock having a frequency substantially P/Q times the high frequency clock, wherein P and Q are integers having predetermined values and P is less than Q, the method comprising the steps of:
switching Q from one of a first plurality of values to a second one of the first plurality of values;
detecting an occurrence of a predetermined phase relationship of the high and low frequency clocks for said second one of the first plurality of values;
asserting an occurrence signal in response to the occurrence of the predetermined phase relationship;
responsive to the high frequency clock and to the assertion of the occurrence signal, generating a first transfer signal during a safe transfer window according to P and Q and the occurrence of the predetermined phase relationship for said second one of the first plurality of values; and
responsive to the first transfer signal, providing synchronous transmission and reception of data between the high and low frequency devices.

20. The method of claim 19 further comprising the step of:
synchronously transferring the data from one of the high and low frequency devices to the other during the first transfer signal.

21. The method of claim 19 wherein the safe transfer window is at least one period of the high frequency clock when the data to be transferred is stable and the device receiving the data is capable of receiving the data.

22. The method of claim 19 wherein the predetermined phase relationship is a substantially coincident edge of the high and low frequency clocks.

* * * * *